United States Patent [19]

Sakiura et al.

[11] Patent Number: 5,765,743

[45] Date of Patent: Jun. 16, 1998

[54] OUTDOOR INSTALLATION TYPE CABINET

[75] Inventors: Jun Sakiura; Yasushi Kojima; Naoya Yamazaki; Kazuhiro Iino; Motoko Nakamura, all of Kawasaki, Japan

[73] Assignee: Fujitsu Limited, Kanagawa, Japan

[21] Appl. No.: 746,988

[22] Filed: Nov. 19, 1996

[30] Foreign Application Priority Data

Jun. 13, 1996 [JP] Japan .................................. 8-152013

[51] Int. Cl.$^6$ ........................................................ F24F 7/08
[52] U.S. Cl. .......................... 236/49.3; 165/80.3; 361/695; 361/696; 454/184
[58] Field of Search .................... 236/49.3; 165/80.3, 165/104.33, 104.34; 361/694, 695, 696, 697; 454/184

[56] References Cited

U.S. PATENT DOCUMENTS

| | | | |
|---|---|---|---|
| 4,126,269 | 11/1978 | Bruges | 361/695 |
| 5,054,545 | 10/1991 | Ghaemian | 165/104.33 |
| 5,168,171 | 12/1992 | Tracewell | 361/695 |
| 5,210,680 | 5/1993 | Scheiber | 165/80.3 |
| 5,361,188 | 11/1994 | Kondou et al. | 165/104.33 |
| 5,422,787 | 6/1995 | Gourdine | 361/697 |
| 5,424,915 | 6/1995 | Katooka et al. | 361/695 |

Primary Examiner—William E. Tapoical
Attorney, Agent, or Firm—Helfgott & Karas, P.C.

[57] ABSTRACT

An outdoor installation type cabinet which accommodates electronic equipment has a number of thin tubes which form an outside air passage and outside air is allowed to flow in the outside air passage by operating an external fan. A heat exchanger which is spaced from each wall of the cabinet is provided at a midway portion of the outside air passage to perform heat exchange between the outside air flowing in the outside air passage and inside air present in the equipment accommodating portion. A circulating fan is installed in the equipment accommodating portion to circulate the inside air. A bimetal is mounted on each side wall of the cabinet to detect a temperature of each side wall and control operations of the external fan, the circulating fan, and an internal fan according to the temperature detected. If the temperature of one side wall is higher than the temperature of the opposite side wall under given temperature conditions, the operation of only the circulating fan on that one side wall is stopped in to thereby suppress the entry of heat of solar radiation through that one side wall into the cabinet body and simultaneously continue to cool the interior of the cabinet.

9 Claims, 10 Drawing Sheets

OUTDOOR INSTALLATION TYPE CABINET

BACKGROUND OF THE INVENTION

1. Field of the Invention

The present invention relates to an outdoor installation type cabinet adapted to be installed outdoors for accommodating electronic equipment such as communication equipment, and more particularly to a cooling or radiating technique for such an outdoor installation type cabinet.

2. Description of the Related Art

A conventional outdoor installation type cabinet for accommodating communication equipment will now be described. A cabinet body is formed in a substantially box-shaped configuration, and has biparting doors forming a front surface. A pair of partition walls are provided in the cabinet body so as to extend between opposite side walls of the cabinet body, thereby dividing a space inside of the cabinet body into three chambers vertically layered. The lowermost chamber is defined as a battery accommodating portion for accommodating a storage battery for backup, the intermediate chamber is defined as an equipment accommodating portion for accommodating the communication equipment, and the uppermost chamber is defined as a heat exchanging portion. The partition wall partitioning the equipment accommodating portion and the heat exchanging portion is provided with a heat exchanger consisting of radiating fins projecting into the equipment accommodating portion and radiating fins projecting into the heat exchanging portion. Each side wall of the cabinet body is formed with ventilation openings at positions corresponding to the heat exchanging portion and the battery accommodating portion. An external fan is provided in the heat exchanging portion in the vicinity of each ventilation opening, and a plurality of internal fans are provided in the equipment accommodating portion. The internal fans are operated when a temperature inside the equipment accommodating portion becomes a given temperature, whereas the external fans are operated when the temperature becomes another given temperature during operation of the internal fans.

A part of heat generated from the communication equipment accommodated in the equipment accommodating portion is radiated to the outside of the cabinet body through the side walls (left side wall, right side wall, front wall, and rear wall) of the cabinet body by natural convection in the inoperative condition of the internal fans or by forced convection in the operative condition of the internal fans. Another part of the heat generated from the communication equipment accommodated in the equipment accommodating portion is radiated to the outside of the cabinet body through the heat exchanger positively in the operative condition of the external fans or naturally in the inoperative condition of the external fans. The internal fans and the external fans are operated or stopped according to the temperature inside the equipment accommodating portion, thereby maintaining the temperature inside the cabinet body at a constant value or less and avoiding unnecessary operation of the fans in cold weather. In the battery accommodating portion, an electrolytic type storage battery is accommodated for the purpose of backup in the event of power failure or the like. There is a possibility of generation of a harmful gas such as hydrogen from the storage battery due to charging of the storage battery. The harmful gas is naturally ejected through the ventilation openings of the opposite side walls of the cabinet body.

In the above-mentioned conventional cabinet, the heat exchanging portion is defined at the upper portion of the cabinet body. Accordingly, a top wall of the cabinet body cannot be used as a radiating surface, so that the radiation efficiency is low. Further, the air inside the cabinet body is allowed to flow along all the side walls of the cabinet body irrespective of solar radiation. That is, in a time zone of daytime, the amount of solar radiation onto the side walls of the cabinet body is small, so that the radiation characteristics through the side walls of the cabinet body are good. However, in a time zone of morning or evening, the amount of solar radiation onto either side wall is large, so that the air flow in the cabinet body adversely accelerates the entry of heat of solar radiation through either side wall into the cabinet body, thus reducing the radiation characteristics. In addition, the time of operation of the external fans as a noise source is increased. Furthermore, the ejection of the harmful gas such as hydrogen generated from the storage battery is insufficient, causing a lack of safety.

SUMMARY OF THE INVENTION

It is therefore an object of the present invention to provide an outdoor installation type cabinet which can improve radiation characteristics.

It is another object of the present invention to provide an outdoor installation type cabinet which can perform high-efficiency ejection of a harmful gas generated from a storage battery.

In accordance with an aspect of the present invention, there is provided an outdoor installation type cabinet for accommodating electronic equipment, comprising a substantially box-shaped cabinet body having a side wall formed with a plurality of first ventilation openings; an outside air passage provided in the cabinet body so as to extend between the first ventilation openings of the side wall of the cabinet body; an external fan for generating a flow of outside air in said outside air passage; a heat exchanging means provided in said cabinet body so as to be spaced from an inner surface of said side wall of said cabinet body, for performing heat exchange between the outside air flowing in the outside air passage and inside air present in the cabinet body; a circulating fan provided in the cabinet body, for circulating the inside air present in the cabinet body; and a temperature detecting and controlling means for detecting a temperature of the side wall of the cabinet body and controlling operations of the external fan and the circulating fan according to the temperature detected.

According to the present invention, not only the side wall of the cabinet body, but also a top wall (top surface) of the cabinet body can be used as a radiating surface, thereby improving the radiation characteristics. Further, the operations of the external fan and the circulating fan are controlled according to the temperature of the side wall of the cabinet body. Accordingly, in a time zone of morning or evening such that the amount of solar radiation onto the left or right side wall of the cabinet body is relatively large, the operation of the circulating fan for the left or right side wall having a higher temperature is stopped to thereby suppress the entry of heat of solar radiation through the left or right side wall into the cabinet body, and also shorten the time of operation of the external fan as a noise source.

Preferably, the cabinet body has a partition wall formed with a second ventilation opening. The partition wall divides a space inside of the cabinet body into an upper section as an equipment accommodating portion for accommodating the electronic equipment and a lower portion as a battery accommodating portion for accommodating a storage battery. A portion of the side wall of the cabinet body corresponding to the battery accommodating portion is formed with a third ventilation opening. The outside air passage further extends between the first ventilation openings and the second ventilation opening. With this structure, ventilation of the battery accommodating portion can be performed by the operation of the external fan simultaneously with heat radiation, thereby improving the safety.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
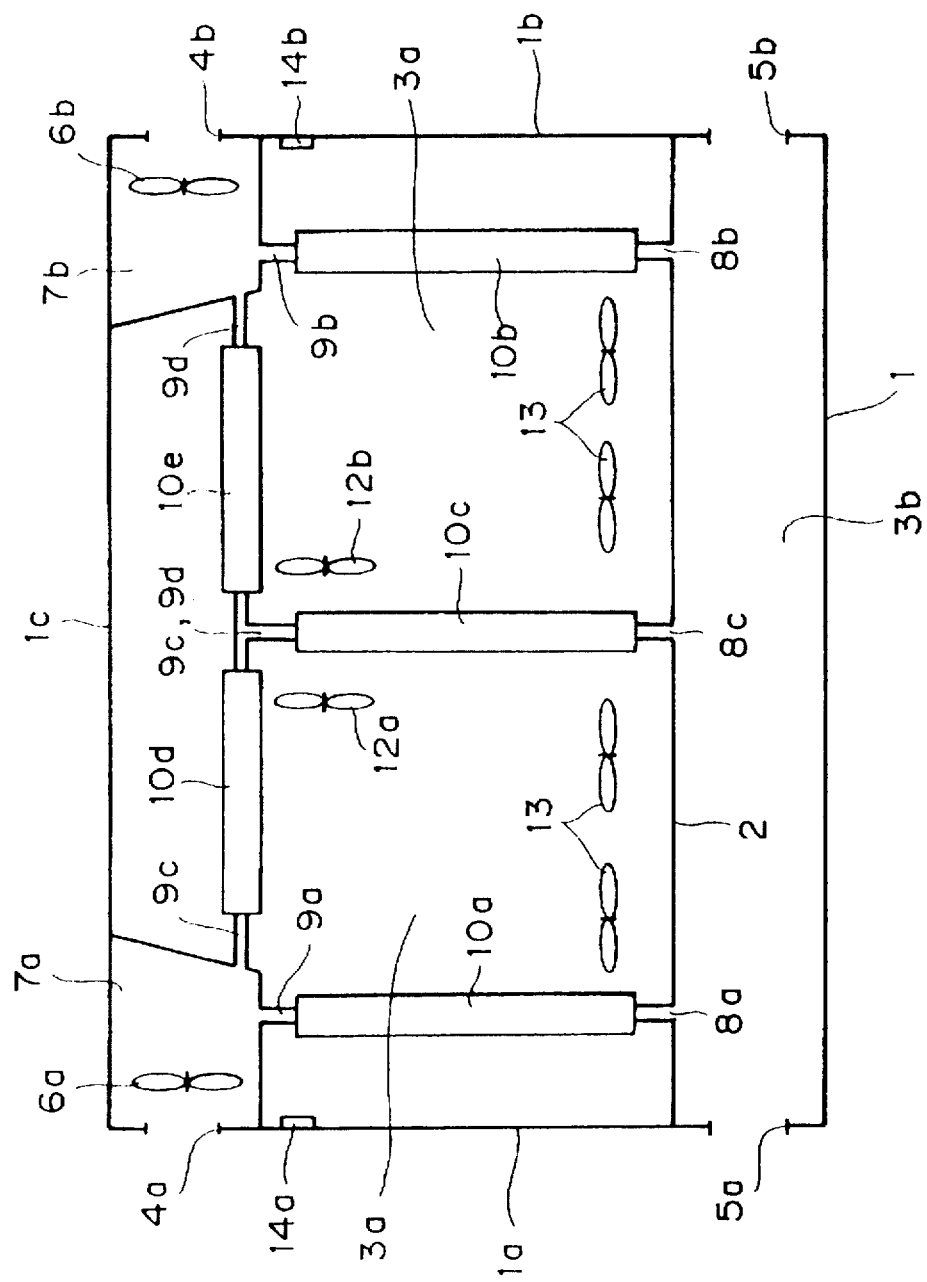
FIG. 1 is a schematic sectional view showing the configuration of a cabinet according to a preferred embodiment of the present invention.
Figure 2:
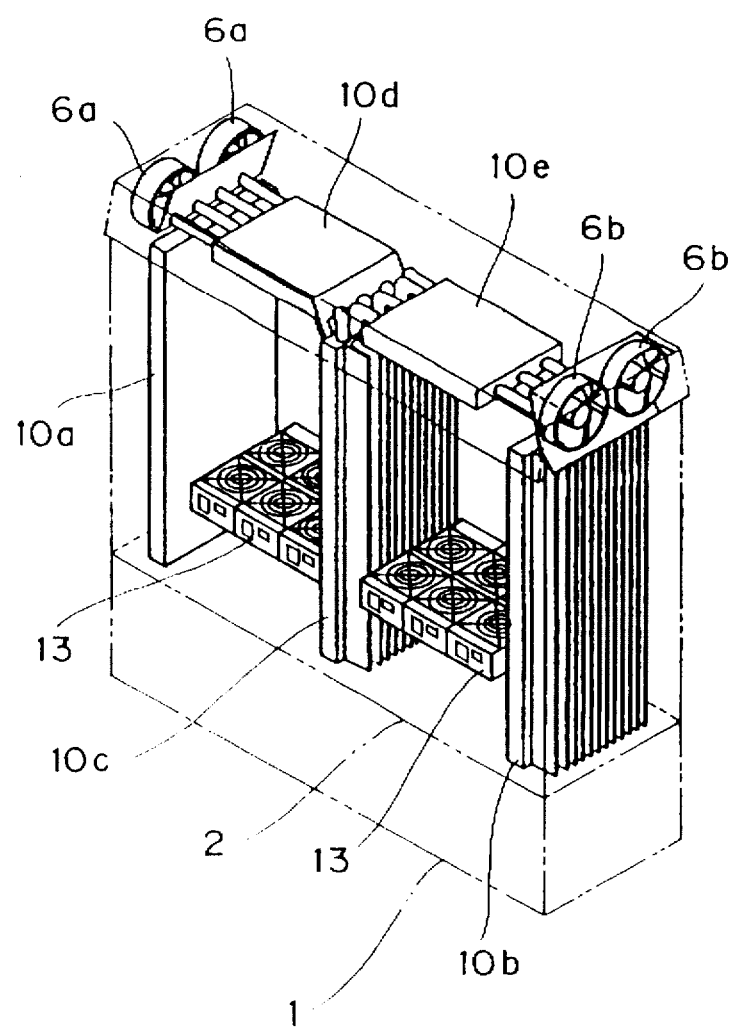
FIG. 2 is a perspective view of the cabinet with a part thereof omitted according to the preferred embodiment.
Figure 3:
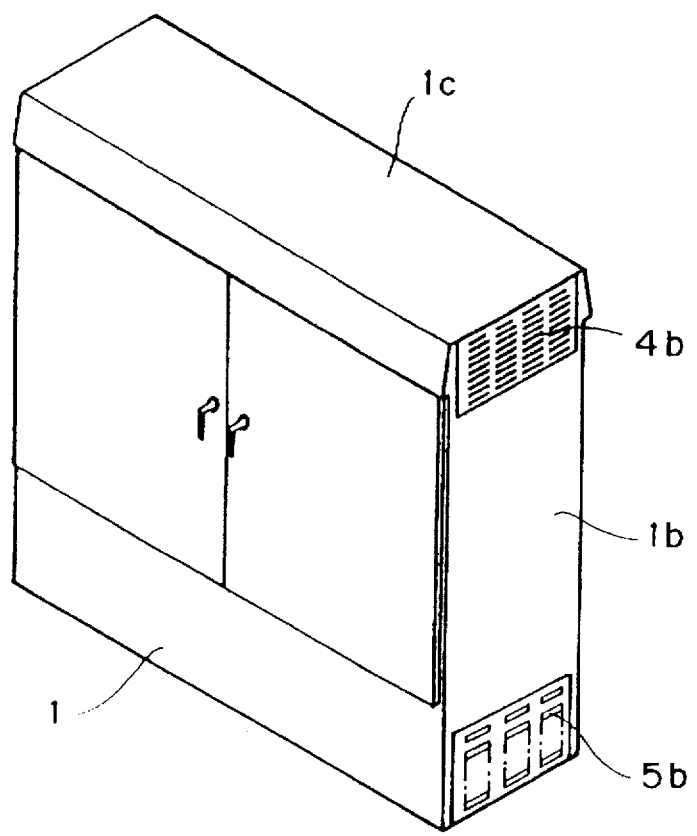
FIG. 3 is an external perspective view of the cabinet according to the preferred embodiment.

Referring to FIGS. 1 to 3, reference numeral 1 denotes a cabinet body. The cabinet body 1 is formed in a substantially box-shaped configuration having a front wall, a rear wall, a left side wall 1a, a right side wall 1a, a top wall 1c, and a bottom wall. The front wall is formed as biparting doors. A partition wall 2 is provided inside the cabinet body 1 in the vicinity of a lower portion thereof so as to extend between the left side wall 1a and the right side wall 1b and thereby divide the space inside the cabinet body 1 into two, upper and lower chambers. The upper chamber is defined as an equipment accommodating portion 3a for accommodating communication equipment (not shown), and the lower chamber is defined as a battery accommodating portion 3b for accommodating an electrolytic type storage battery (not shown) for power supply (backup) in the event of emergency. Upper ventilation openings 4a and 4b are respectively formed through the left side wall 1a and the right side wall 1b of the cabinet body 1 at upper positions in the vicinity of the top wall 1c. Lower ventilation openings 5a and 5b are respectively formed through the left side wall 1a and the right side wall 1b of the cabinet body 1 at lower positions corresponding to the left and right side walls defining the storage accommodating portion 3b.

A first external fan accommodating chamber 7a for accommodating a first external fan 6a is defined in the vicinity of the upper ventilation opening 4a of the left side wall 1a. A second external fan accommodating chamber 7b for accommodating a second external fan 6b is defined in the vicinity of the upper ventilation opening 4b of the right side wall 1b. The first external fan 6a is provided so as to discharge the air in the first external fan accommodating chamber 7a from the upper ventilation opening 4a. The second external fan 6b is provided so as to discharge the air in the second external fan accommodating chamber 7b from the upper ventilation opening 4b. Each of the first and second external fans 6a and 6b has two modes, that is, a low-speed mode and a high-speed mode. A plurality of ventilation openings 8a, 8b, and 8c are formed through the partition wall 2 at a left portion near the left side wall 1a, a right portion near the right side wall 1b, and a central portion, respectively. A first outside air passage 9a composed of a plurality of thin tubes is provided between the first external fan accommodating chamber 7a and the ventilation opening 8a of the partition wall 2 near the left side wall 1a. A second outside air passage 9b composed of a plurality of thin tubes is provided between the second external fan accommodating chamber 7b and the ventilation opening 8b of the partition wall 2 near the right side wall 1b. A third outside air passage 9c composed of a plurality of thin tubes is provided between the first external fan accommodating chamber 7a and the central ventilation opening 8c of the partition wall 2. A fourth outside air passage 9d composed of a plurality of thin tubes is provided between the second external fan accommodating chamber 7b and the central ventilation opening 8c of the partition wall 2.

Figure 4:
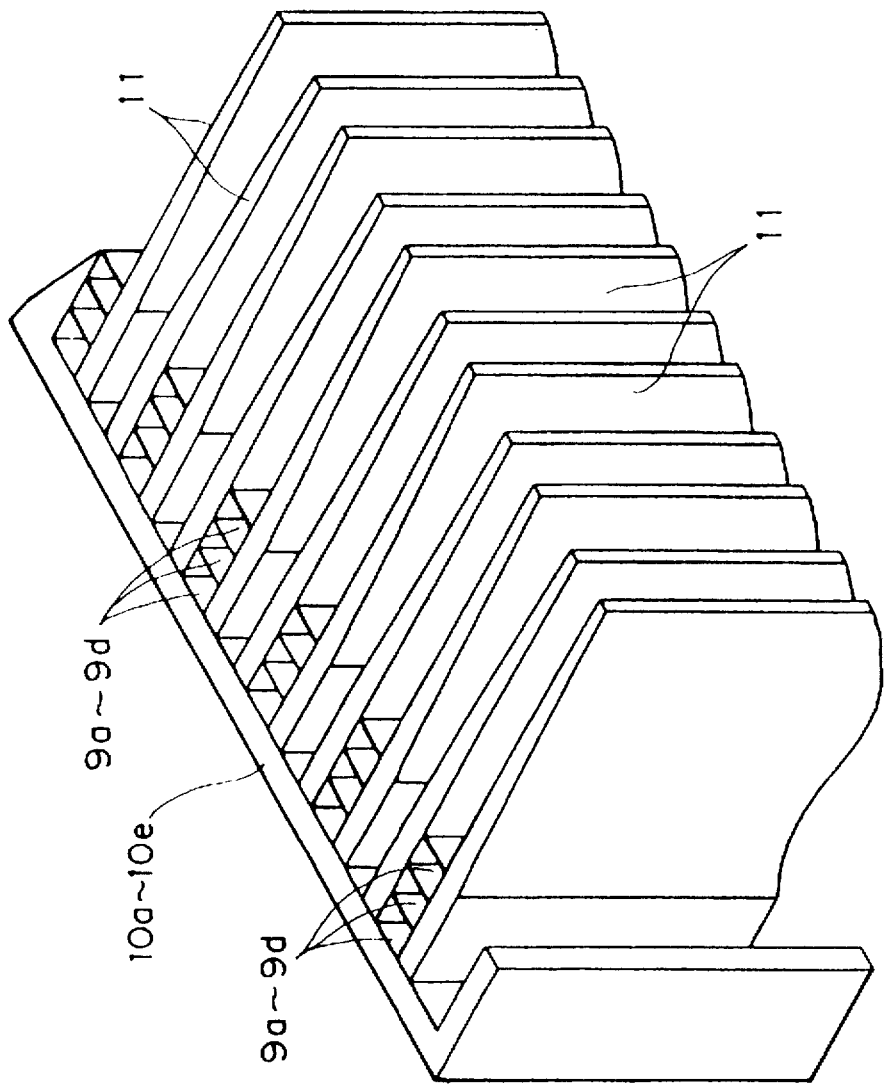
FIG. 4 is a perspective view of a heat exchanger in the cabinet according to the present invention.

A first heat exchanger 10a for performing heat exchange between the outside air flowing in the first outside air passage 9a and the inside air present in the cabinet body 1 is mounted on the first outside air passage 9a so as to be spaced from the inner surface of the left side wall 1a. A second heat exchanger 10b for performing heat exchange between the outside air flowing in the second outside air passage 9b and the inside air present in the cabinet body 1 is mounted on the second outside air passage 9b so as to be spaced from the inner surface of the right side wall 1b. A third heat exchanger 10c for performing heat exchange between the outside air flowing in the third outside air passage 9c and the fourth outside air passage 9d and the inside air present in the cabinet body 1 is mounted on vertical portions of the third and fourth outside air passages 9c and 9d. A fourth heat exchanger 10d for performing heat exchange between the outside air flowing in the third outside air passage 9c and the inside air present in the cabinet body 1 is mounted on a horizontal portion of the third outside air passage 9c so as to be spaced from the inner surface of the top wall 1c. A fifth heat exchanger 10e for performing heat exchange between the outside air flowing in the fourth outside air passage 9d and the inside air present in the cabinet body 1 is mounted on a horizontal portion of the fourth outside air passage 9d so as to be spaced from the inner surface of the top wall 1c. Each of the first to fifth heat exchangers 10a to 10e is formed of metal such as aluminum, and has a plurality of thin tubes forming each of the outside air passages 9a to 9d and a plurality of radiating fins 11 as shown in FIG. 4.

A first circulating fan 12a and a second circulating fan 12b for circulating the air in the equipment accommodating portion 3a of the cabinet body 1 are provided in the equipment accommodating portion 3a. A plurality of internal fans 13 for agitating or the like the air in the equipment accommodating portion 3a are also provided in the equipment accommodating portion 3a. A plurality of bimetals 14a operating according to a temperature of the left side wall 1a are mounted on the left side wall 1a at positions just below the first external fan accommodating chamber 7a. A plurality of bimetals 14b operating according to a temperature of the right side wall 1b are mounted on the right side wall 1b at positions just below the second external fan accommodating chamber 7b. These bimetals 14a and 14b are means for on/off controlling corresponding feeder circuits for the first external fan 6a, the second external fan 6b, the first circulating fan 12a, the second circulating fan 12b, and the internal fans 13 according to a plurality of predetermined temperatures.

There is a possibility that the storage battery accommodated in the battery accommodating portion 3b may generate hydrogen because of deterioration or the like, causing a dangerous condition unless ventilation is performed. To avoid this problem, there is provided hydrogen generation detecting means (not shown) for detecting the generation of hydrogen by sensing a charging current into the storage battery. When the generation of hydrogen is detected in an inoperative condition of the first and second external fans 6a and 6b, the first and second external fans 6a and 6b are operated by another control system to be hereinafter described, thereby performing ventilation of the storage accommodating portion 3b.

There will now be described operation control of the first external fan 6a, the second external fan 6b, the first circulating fan 12a, the second circulating fan 12b, and the internal fans 13 with reference to the flowchart shown in FIGS. 5 to 10. Let $S_1$ and $S_2$ denote the temperatures of the left side wall 1a and the right side wall 1b, respectively. Let $T_1$, $T_2$, $T_3$, $T_4$, and $T_5$ denote the five preset temperatures (the first set temperature, the second set temperature, the third set temperature, the fourth set temperature, and the fifth set temperature in an ascending order), respectively, and tc denote the preset temperature range. For example, the first set temperature $T_1$ is 30° C., the second set temperature $T_2$ is 40° C., the third set temperature $T_3$ is 50° C., the fourth set temperature $T_4$ is 60° C., the fifth set temperature $T_5$ is 70° C., and the set temperature range tc is 10 degrees. The set temperatures $T_1$, $T_2$, $T_3$, $T_4$, and $T_5$ and the set temperature range tc may be arbitrarily decided according to a heating value of the communication equipment to be accommodated, an installation environment of the cabinet, etc.

Figure 5:
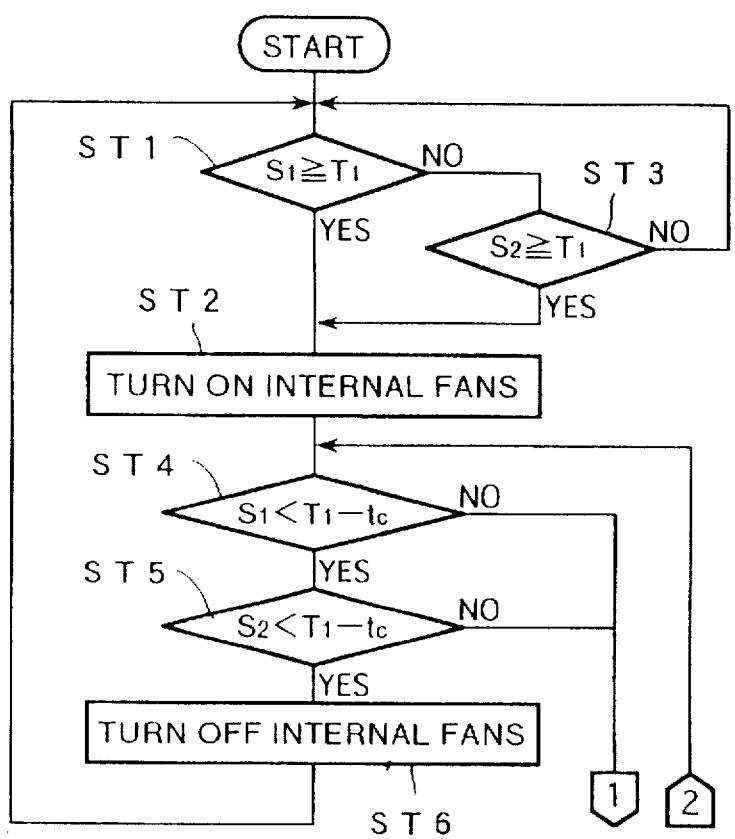
FIGS. 5 to 10 are a flowchart showing operation control of fans in the cabinet according to the present invention.

Referring first to FIG. 5, the temperature $S_1$ of the left side wall 1a is compared with the first set temperature $T_1$ (step 1; "step" will be hereinafter referred to as "ST"). If the temperature $S_1$ of the left side wall 1a is higher than or equal to the first set temperature $T_1$ in ST 1, the internal fans 13 are turned on (operated) (ST 2). If the temperature $S_1$ of the left side wall 1a is lower than the first set temperature $T_1$ in ST 1, the temperature $S_2$ of the right side wall 1b is compared with the first set temperature $T_1$, (ST 3). If the temperature $S_2$ of the right side wall 1b is higher than or equal to the first set temperature $T_1$ in ST 3, the program proceeds to ST 2, whereas if the temperature $S_2$ of the right side wall 1b is lower than the first set temperature $T_1$ in ST 3, the program returns to ST 1. In ST 4, the temperature $S_1$ of the left side wall 1a is compared with a value obtained by subtracting the set temperature range tc from the first set temperature $T_1$. If the temperature $S_1$ of the left side wall 1a is lower than the value obtained by subtracting the set temperature range tc from the first set temperature $T_1$ in ST 4, the program proceeds to ST 5. In ST 5, the temperature $S_2$ of the right side wall 1b is compared with the value obtained by subtracting the set temperature range tc from the first set temperature $T_1$. If the temperature $S_2$ of the right side wall 1b is lower than the value obtained by subtracting the set temperature range tc from the first set temperature $T_1$ in ST 5, the internal fans 13 are turned off (stopped), and the program then returns to ST 1. If the temperature $S_1$ of the left side wall 1a is higher than or equal to the value obtained by subtracting the set temperature range tc from the first set temperature $T_1$ in ST 4, or if the temperature $S_2$ of the right side wall 1b is higher than or equal to the value obtained by subtracting the set temperature range tc from the first set temperature $T_1$ in ST 5, the program proceeds to ST 7 shown in FIG. 6.

Figure 6:
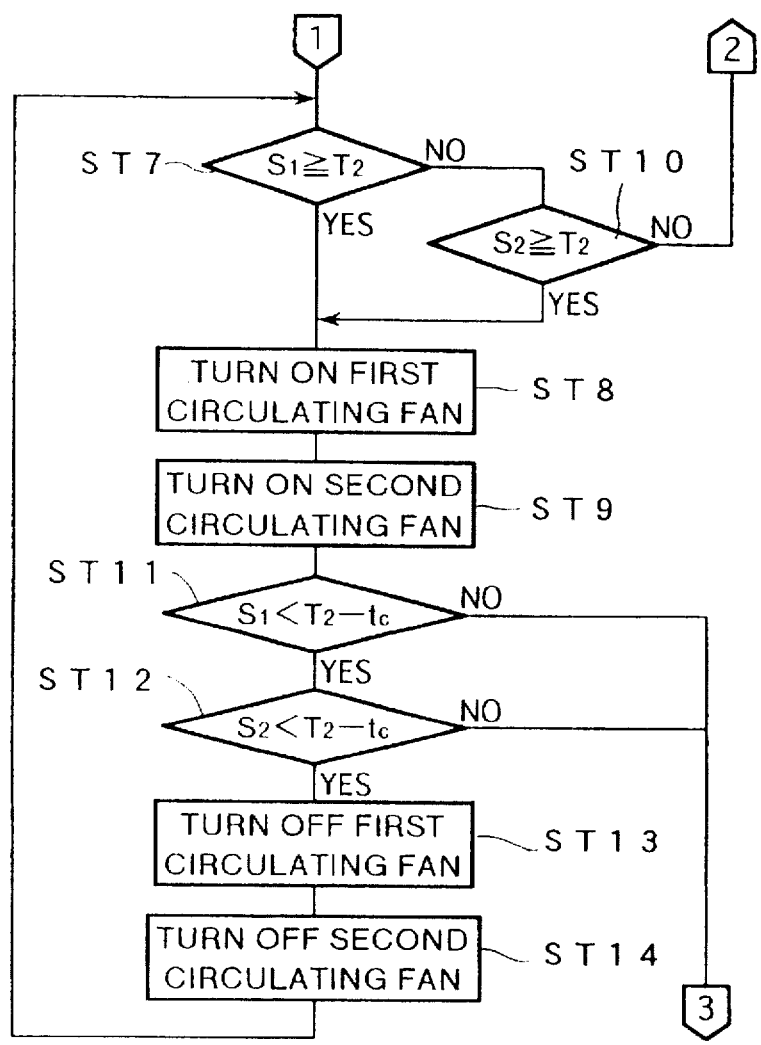

Referring next to FIG. 6, the temperature $S_1$ of the left side wall 1a is compared with the second set temperature $T_2$ (ST 7). If the temperature $S_1$ of the left side wall 1a is higher than or equal to the second set temperature $T_2$ in ST 7, the first circulating fan 12a and the second circulating fan 12b are turned on (operated) (ST 8 and ST 9). If the temperature $S_1$ of the left side wall 1a is lower than the second set temperature $T_2$ in ST 7, the temperature $S_2$ of the right side wall 1b is compared with the second set temperature $T_2$ (ST 10). If the temperature $S_2$ of the right side wall 1b is higher than or equal to the second set temperature $T_2$ in ST 10, the program proceeds to ST 8, whereas if the temperature $S_2$ of the right side wall 1b is lower than the second set temperature $T_2$ in ST 10, the program returns to ST 4 shown in FIG. 5. In ST 11, the temperature $S_1$ of the left side wall 1a is compared with a value obtained by subtracting the set temperature range tc from the second set temperature $T_2$. If the temperature $S_1$ of the left side wall 1a is lower than the value obtained by subtracting the set temperature range tc from the second set temperature $T_2$ in ST 11, the program proceeds to ST 12. In ST 12, the temperature $S_2$ of the right side wall 1b is compared with the value obtained by subtracting the set temperature range tc from the second set temperature $T_2$. If the temperature $S_2$ of the right side wall 1b is lower than the value obtained by subtracting the set temperature range tc from the second set temperature $T_2$ in ST 12, the first circulating fan 12a and the second circulating fan 12b are turned off (stopped) (ST 13 and ST 14), and the program then returns to ST 7. If the temperature $S_1$ of the left side wall 1a is higher than or equal to the value obtained by subtracting the set temperature range tc from the second set temperature $T_2$ in ST 11, or if the temperature $S_2$ of the right side wall 1b is higher than or equal to the value obtained by subtracting the set temperature range tc from the second set temperature $T_2$ in ST 12, the program proceeds to ST 15 shown in FIG. 7.

Figure 7:
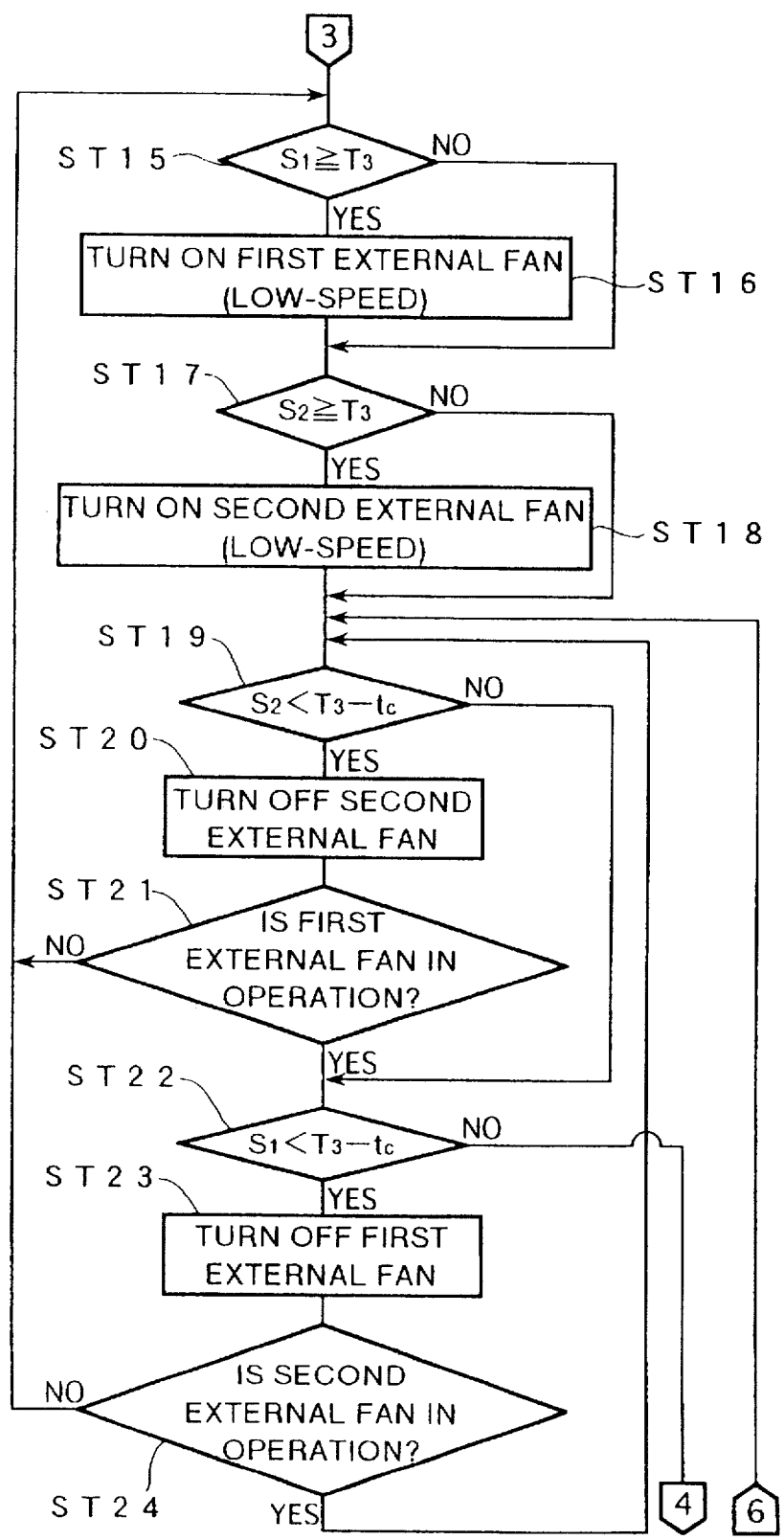

Referring to FIG. 7, the temperature $S_1$ of the left side wall 1a is compared with the third set temperature $T_3$ (ST 15). If the temperature $S_1$ of the left side wall 1a is higher than or equal to the third set temperature $T_3$ in ST 15, the first external fan 6a is turned on (operated) in the low-speed mode (ST 16), and the program proceeds to ST 17. If the temperature $S_1$ of the left side wall 1a is lower than the third set temperature $T_3$ in ST 15, the program skips ST 16 to proceed to ST 17. In ST 17, the temperature $S_2$ of the right side wall 1b is compared with the third set temperature $T_3$. If the temperature $S_2$ of the right side wall 1b is higher than or equal to the third set temperature $T_3$ in ST 17, the second external fan 6b is turned on (operated) in the low-speed mode (ST 18), and the program proceeds to ST 19. If the temperature $S_2$ of the right side wall 1b is lower than the third set temperature $T_3$ in ST 17, the program skips ST 18 to proceed to ST 19. In ST 19, the temperature $S_2$ of the right side wall 1b is compared with a value obtained by subtracting the set temperature range tc from the third set temperature $T_3$. If the temperature $S_2$ of the right side wall 1b is lower than the value obtained by subtracting the set temperature range tc from the third set temperature $T_3$ in ST 19, the second external fan 6b is turned off (stopped) (ST 20), and whether or not the first external fan 6a is in operation is determined in ST 21. If the first external fan 6a is not in operation in ST 21, the program returns to ST 15. If the temperature $S_2$ of the right side wall 1b is higher than or equal to the value obtained by subtracting the set temperature range tc from the third set temperature $T_3$ in ST 19, or if the first external fan 6a is in operation in ST 21, the program proceeds to ST 22. In ST 22, the temperature $S_1$ of the left side wall 1a is compared with the value obtained by subtracting the set temperature range tc from the third set temperature $T_3$. If the temperature $S_1$ of the left side wall 1a is lower than the value obtained by subtracting the set temperature range tc from the third set temperature $T_3$ in ST 22, the first external fan 6a is turned off (stopped) (ST 23), and whether or not the second external fan 6b is in operation is determined in ST 24. If the second external fan 6b is not in operation in ST 24, the program returns to ST 15, whereas if the second external fan 6b is in operation in ST 24, the program returns to ST 19. If the temperature $S_1$ of the left side wall 1a is higher than or equal to the value obtained by subtracting the set temperature range tc from the third set temperature $T_3$ in ST 22, the program proceeds to ST 25 shown in FIG. 8.

Figure 8:
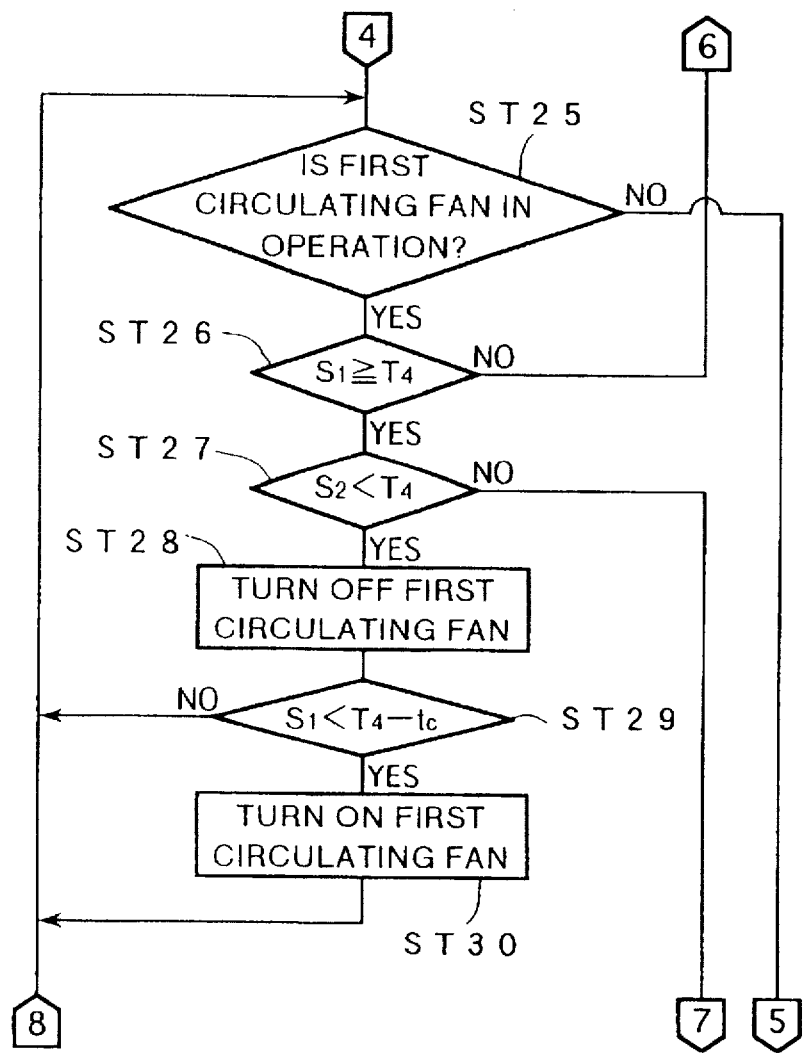

Referring to FIG. 8, whether or not the first circulating fan 12a is in operation is determined (ST 25). If the first circulating fan 12a is not in operation in ST 25, the program proceeds to ST 31 shown in FIG. 9, whereas if the first circulating fan 12a is in operation in ST 25, the program proceeds to ST 26. In ST 26, the temperature $S_1$ of the left side wall 1a is compared with the fourth set temperature $T_4$. If the temperature $S_1$ of the left side wall 1a is lower than the fourth set temperature $T_4$ in ST 26, the program returns to ST 19 shown in FIG. 7, whereas if the temperature $S_1$ of the left side wall 1a is higher than or equal to the fourth set temperature $T_4$ in ST 26, the program proceeds to ST 27. In ST 27, the temperature $S_2$ of the right side wall 1b is compared with the fourth set temperature $T_4$. If the temperature $S_2$ of the right side wall 1b is higher than or equal to the fourth set temperature $T_4$ in ST 27, the program proceeds to ST 41 shown in FIG. 10, whereas if the temperature $S_2$ of the right side wall 1b is lower than the fourth set temperature $T_4$ in ST 27, the first circulating fan 12a is turned off (stopped) (ST 28), and the program then proceeds to ST 29. In ST 29, the temperature $S_1$ of the left side wall 1a is compared with a value obtained by subtracting the set temperature range tc from the fourth set temperature $T_4$. If the temperature $S_1$ of the left side wall 1a is higher than or equal to the value obtained by subtracting the set temperature range tc from the fourth set temperature $T_4$ in ST 29, the program returns to ST 25, whereas if the temperature $S_1$ of the left side wall 1a is lower than the value obtained by subtracting the set temperature range tc from the fourth set temperature $T_4$ in ST 29, the first circulating fan 12a is turned on (operated) (ST 30), and the program returns to ST 25.

Figure 9:
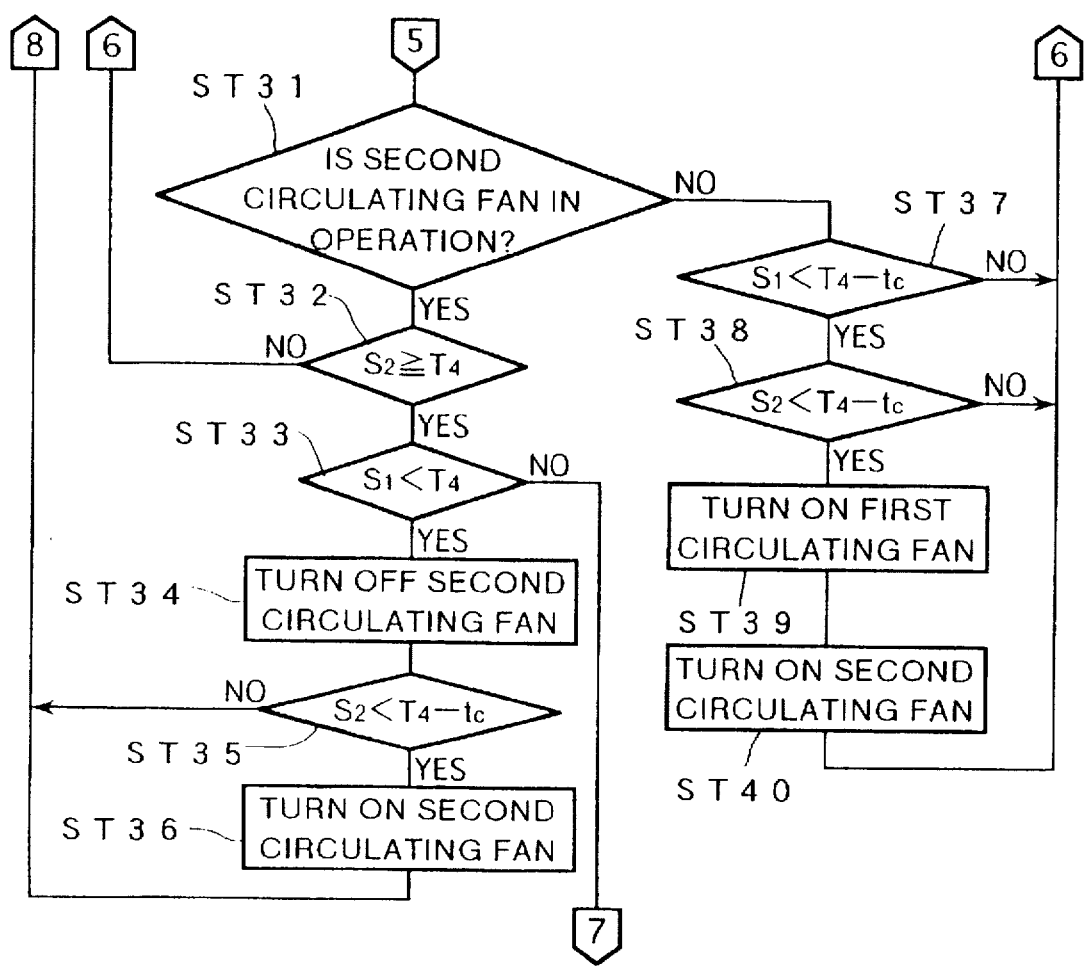

Referring to FIG. 9, whether or not the second circulating fan 12b is in operation is determined (ST 31). If the second circulating fan 12b is not in operation in ST 31, the program proceeds to ST 37, whereas if the second circulating fan 12b is in operation in ST 31, the program proceeds to ST 32. In ST 32, the temperature $S_2$ of the right side wall 1b is compared with the fourth set temperature $T_4$. If the temperature $S_2$ of the right side wall 1b is lower than the fourth set temperature $T_4$ in ST 32, the program returns to ST 19 shown in FIG. 7, whereas if the temperature $S_2$ of the right side wall 1b is higher than or equal to the fourth set temperature $T_4$ in ST 32, the program proceeds to ST 33. In ST 33, the temperature $S_1$ of the left side wall 1a is compared with the fourth set temperature $T_4$. If the temperature $S_1$ of the left side wall 1a is higher than or equal to the fourth set temperature $T_4$ in ST 33, the program proceeds to ST 41 shown in FIG. 10, whereas if the temperature $S_1$ of the left side wall 1a is lower than the fourth set temperature $T_4$ in ST 33, the second circulating fan 12b is turned off (stopped) (ST 34), and the program then proceeds to ST 35.

In ST 35, the temperature $S_2$ of the right side wall 1b is compared with the value obtained by subtracting the set temperature range tc from the fourth set temperature $T_4$. If the temperature $S_2$ of the right side wall 1b is higher than or equal to the value obtained by subtracting the set temperature range tc from the fourth set temperature $T_4$ in ST 35, the program returns to ST 25 shown in FIG. 8, whereas if the temperature $S_2$ of the right side wall 1b is lower than the value obtained by subtracting the set temperature range tc from the fourth set temperature $T_4$ in ST 35, the second circulating fan 12b is turned on (operated) (ST 36), and the program then returns to ST 25 shown in FIG. 8.

Figure 10:
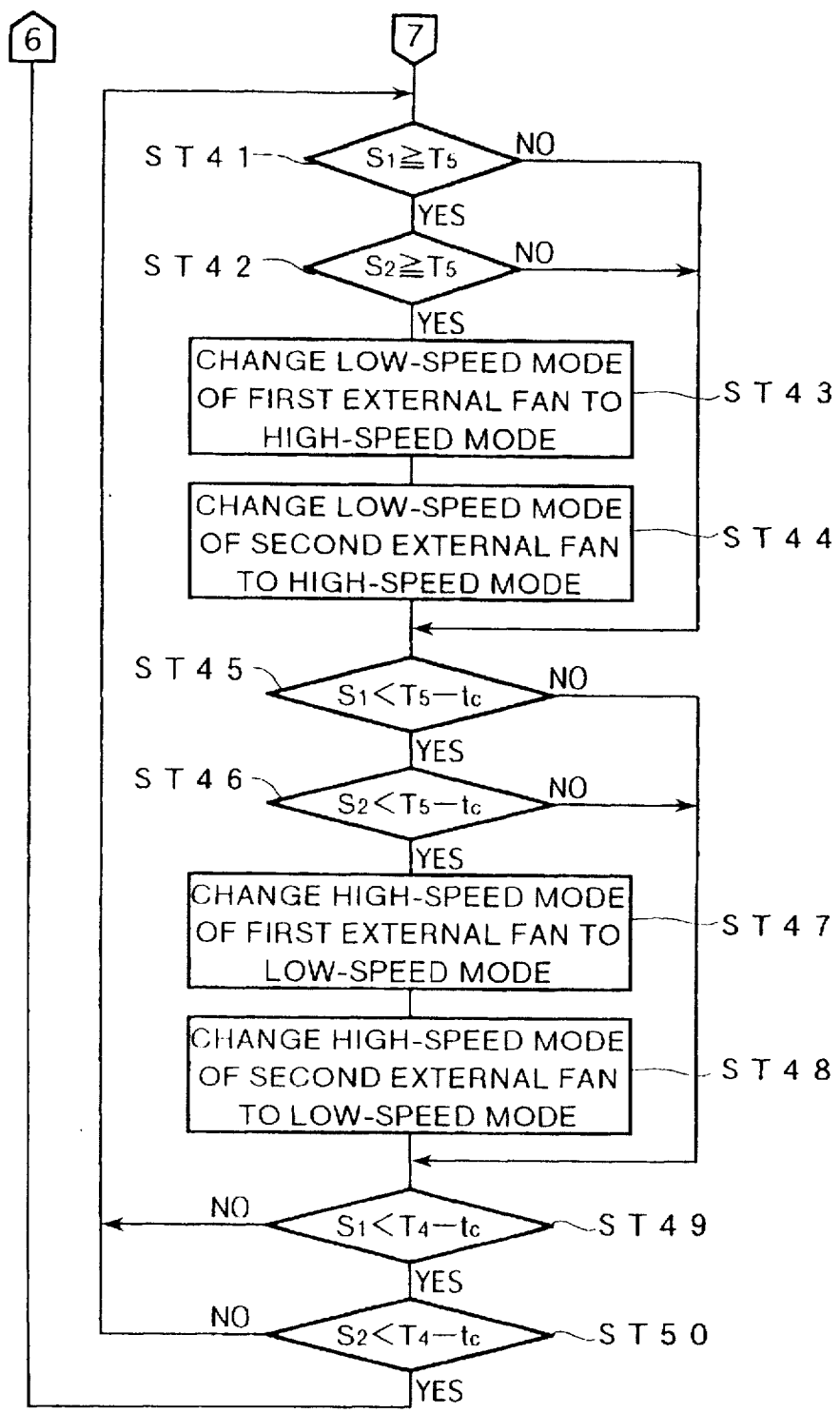

Referring to FIG. 10, the temperature $S_1$ of the left side wall 1a is compared with the fifth set temperature $T_5$ in ST 41. If the temperature $S_1$ of the left side wall 1a is lower than the fifth set temperature $T_5$ in ST 41, the program proceeds to ST 45, whereas if the temperature $S_1$ of the left side wall 1a is higher than or equal to the fifth set temperature $T_5$ in ST 41, the program proceeds to ST 42. In ST 42, the temperature $S_2$ of the right side wall 1b is compared with the fifth set temperature $T_5$. If the temperature $S_2$ of the right side wall 1b is lower than the fifth set temperature $T_5$ in ST 42, the program proceeds to ST 45, whereas if the temperature $S_2$ of the right side wall 1b is higher than or equal to the fifth set temperature $T_5$ in ST 42, the low-speed mode of the first external fan 6a is changed to the high-speed mode (ST 43), and the low-speed mode of the second external fan 6b is also changed to the high-speed mode (ST 44). Then, the program proceeds to ST 45. In ST 45, the temperature $S_1$ of the left side wall 1a is compared with a value obtained by subtracting the set temperature range tc from the fifth set temperature $T_5$. If the temperature $S_1$ of the left side wall 1a is higher than or equal to the value obtained by subtracting the set temperature range tc from the fifth set temperature $T_5$ in ST 45, the program proceeds to ST 49, whereas if the temperature $S_1$ of the left side wall 1a is lower than the value obtained by subtracting the set temperature range tc from the fifth set temperature $T_5$ in ST 45, the program proceeds to ST 46. In ST 46, the temperature $S_2$ of the right side wall 1b is compared with the value obtained by subtracting the set temperature range tc from the fifth set temperature $T_5$. If the temperature $S_2$ of the right side wall 1b is higher than or equal to the value obtained by subtracting the set temperature tc from the fifth set temperature $T_5$ in ST 46, the program proceeds to ST 49, whereas if the temperature $S_2$ of the right side wall 1b is lower than the value obtained by subtracting the set temperature range tc from the fifth set temperature $T_5$ in ST 46, the high-speed mode of the first external fan 6a is changed to the low-speed mode (ST 47), and the high-speed mode of the second external fan 6b is also changed to the low-speed mode (ST 48). Then, the program proceeds to ST 49. In ST 49, the temperature $S_1$ of the left side wall 1a is compared with the value obtained by subtracting the set temperature range tc from the fourth set temperature $T_4$.

If the temperature $S_1$ of the left side wall 1a is higher than or equal to the value obtained by subtracting the set temperature range tc from the fourth set temperature $T_4$ in ST 49, the program returns to ST 41, whereas if the temperature $S_1$ of the left side wall 1a is lower than the value obtained by subtracting the set temperature range tc from the fourth set temperature $T_4$ in ST 49, the program proceeds to ST 50. In ST 50, the temperature $S_2$ of the right side wall 1b is compared with the value obtained by subtracting the set temperature range tc from the fourth set temperature $T_4$. If the temperature $S_2$ of the right side wall 1b is higher than or equal to the value obtained by subtracting the set temperature range tc from the fourth set temperature $T_4$ in ST 50, the program returns to ST 41, whereas if the temperature $S_2$ of the right side wall 1b is lower than the value obtained by subtracting the set temperature range tc from the fourth set temperature $T_4$ in ST 50, the program returns to ST 19 shown in FIG. 7.

According to the above preferred embodiment, no heat exchanging portion is provided at the upper portion of the cabinet body unlike the prior art, but the first to fifth heat exchangers 10a to 10e are located so as to be spaced from the left side wall 1a, the right side wall 1b, and the top wall 1c as mentioned above. Accordingly, heat radiation can be effected through all the side walls of the cabinet body 1 except the bottom wall (i.e., the left side wall 1a, the right side wall 1b, the top wall 1c, the front wall, and the rear wall), thereby improving the heat radiation efficiency. Further, the operations of the fans 6a, 6b, 12a, 12b, and 13 are controlled by detecting the temperatures of the left side wall 1a and the right side wall 1b and comparing these temperatures with the predetermined temperatures. Accordingly, high-efficient cooling can be realized. Particularly under given conditions, if the temperature of the left side wall 1a is higher than the temperature of the right side wall 1b, it is regarded that the amount of solar radiation onto the left side wall 1a is relatively large, and the operation of the first circulating fan 12a is stopped. Conversely, if the temperature of the right side wall 1b is higher than the temperature of the left side wall 1a, it is regarded that the amount of solar radiation onto the right side wall 1b is relatively large, and the operation of the second circulating fan 12b is stopped. Accordingly, in a time zone of morning or evening such that the amount of solar radiation onto either side wall is relatively large, the entry of heat of solar radiation into the cabinet can be suppressed to realize high-efficient cooling, and the time of operation of the external fans as a noise source can also be shortened. Further, since the outside air passages 9a, 9b, 9c, and 9d are connected at their upstream ends to the ventilation openings 8a, 8b, and 8c of the partition wall 2, the ventilation of the battery accommodating portion 3b can also be performed by the operation of the first and second external fans 6a and 6b simultaneously with heat radiation. Accordingly, hydrogen generated from the storage battery can be ejected without the use of any special means, thus improving the safety. If the generation of hydrogen is detected in the inoperative condition of the first and second external fans 6a and 6b, the first and second external fans 6a and 6b are operated to ventilate the storage accommodating portion 3b. Therefore, the safety can be further improved.

What is claimed is:

1. An outdoor installation type cabinet for accommodating electronic equipment, comprising:

a substantially box-shaped cabinet body having a side wall formed with a plurality of first ventilation openings;

an outside air passage provided in said cabinet body so as to extend between said first ventilation openings of said side wall of said cabinet body;

an external fan for generating a flow of outside air in said outside air passage;

a heat exchanging means provided in said cabinet body so as to be spaced from an inner surface of said side wall of said cabinet body, for performing heat exchange between said outside air flowing in said outside air passage and inside air present in said cabinet body; and a temperature detecting and controlling means for detecting a temperature of said side wall of said cabinet body and controlling an operation of said external fan according to said temperature detected, wherein said cabinet body has a partition wall formed with a second ventilation opening, said partition wall dividing a space inside of said cabinet body into an upper section as an equipment accommodating portion for accommodating said electronic equipment and a lower section as a battery accommodating portion for accommodating a storage battery;

a portion of said side wall of said cabinet body corresponding to said battery accommodating portion is formed with a third ventilation opening; and said outside air passage further extends between said first ventilation openings and said second ventilation opening.

2. An outdoor installation type cabinet according to claim 1, further comprising a circulating fan provided in said cabinet body, for circulating said inside air present in said cabinet body;

wherein said temperature detecting and controlling means further controls an operation of said circulating fan according to said temperature detected.

3. An outdoor installation type cabinet according to claim 1, wherein said outside air passage comprises a plurality of thin tubes.

4. An outdoor installation type cabinet according to claim 1, wherein said temperature detecting and controlling means comprises a bimetal.

5. An outdoor installation type cabinet according to claim 1, further comprising a harmful gas generation detecting means for detecting generation of a harmful gas from said storage battery accommodated in said battery accommodating portion;

wherein when the generation of said harmful gas is detected by said harmful gas generation detecting means, said external fan is operated.

6. An outdoor installation type cabinet for accommodating electronic equipment, comprising:

a substantially box-shaped cabinet body having a first side wall formed with a first upper ventilation opening and a first lower ventilation opening, and having a second side wall formed with a second upper ventilation opening and a second lower ventilation opening;

a first fan accommodating chamber defined in said cabinet body at a position in the vicinity of said first upper ventilation opening of said first side wall of said cabinet body;

a second fan accommodating chamber defined in said cabinet body at a position in the vicinity of said second upper ventilation opening of said second side wall of said cabinet body;

a first external fan provided in said first fan accommodating chamber so as to discharge air inside said first fan accommodating chamber from said first upper ventilation opening;

a second external fan provided in said second fan accommodating chamber so as to discharge air inside said second fan accommodating chamber from said second upper ventilation opening;

a first outside air passage provided in said cabinet body so as to extend between said first fan accommodating chamber and said first lower ventilation opening;

a second outside air passage provided in said cabinet body so as to extend between said second fan accommodating chamber and said second lower ventilation opening;

a first heat exchanging means provided in said cabinet body so as to be spaced from an inner surface of said first side wall, for performing heat exchange between outside air flowing in said first outside air passage and inside air present in said cabinet body;

a second heat exchanging means provided in said cabinet body so as to be spaced from an inner surface of said second side wall, for performing heat exchange between outside air flowing in said second outside air passage and said inside air present in said cabinet; and a temperature detecting and controlling means for detecting a first temperature as a temperature of said first side wall and a second temperature as a temperature of said second side wall and controlling operations of said first external fan and said second external fan according to results of comparison of said first temperature detected, said second temperature detected, and a plurality of preset temperatures.

7. An outdoor installation type cabinet according to claim 6, further comprising:

a first circulating fan provided in said cabinet body, for circulating a part of said inside air present in said cabinet body in the vicinity of said first side wall; and a second circulating fan provided in said cabinet body, for circulating a part of said inside air present in said cabinet body in the vicinity of said second side wall;

wherein said temperature detecting and controlling means further controls operations of said first circulating fan and said second circulating fan according to said results of comparison of said first temperature detected, said second temperature detected, and said plurality of preset temperatures.

8. An outdoor installation type cabinet according to claim 7, wherein when said first temperature is higher than said second temperature in an operative condition of both said first circulating fan and said second circulating fan, said temperature detecting and controlling means stops the operation of said first circulating fan, whereas when said second temperature is higher than said first temperature in the operative condition of both said first circulating fan and said second circulating fan, said temperature detecting and controlling means stops the operation of said second circulating fan.

9. An outdoor installation type cabinet according to claim 6, wherein said temperature detecting and controlling means comprises a plurality of bimetals.

\* \* \* \* \*